United States Patent
Long et al.

(10) Patent No.: US 7,989,021 B2
(45) Date of Patent: Aug. 2, 2011

(54) VAPORIZING MATERIAL AT A UNIFORM RATE

(75) Inventors: Michael Long, Hilton, NY (US); Bruce E. Koppe, Caledonia, NY (US)

(73) Assignee: Global OLED Technology LLC, Herndon, VA (US)

(*) Notice: Subject to any disclaimer, the term of this patent is extended or adjusted under 35 U.S.C. 154(b) by 995 days.

(21) Appl. No.: 11/190,653

(22) Filed: Jul. 27, 2005

(65) Prior Publication Data

US 2007/0026146 A1    Feb. 1, 2007

(51) Int. Cl.
*C23C 16/448* (2006.01)

(52) U.S. Cl. .................................... 427/248.1

(58) Field of Classification Search ............... 427/248.1; 118/726
See application file for complete search history.

(56) References Cited

U.S. PATENT DOCUMENTS

| | | | |
|---|---|---|---|
| 2,447,789 A | 8/1948 | Barr | |
| 6,296,711 B1 | 10/2001 | Loan et al. | |
| 2003/0008071 A1* | 1/2003 | Van Slyke et al. | 427/255.28 |
| 2004/0062856 A1* | 4/2004 | Marcus et al. | 427/66 |
| 2005/0072361 A1* | 4/2005 | Yang et al. | 118/726 |
| 2006/0062915 A1 | 3/2006 | Long et al. | |
| 2006/0099344 A1 | 5/2006 | Boroson et al. | |
| 2006/0099345 A1* | 5/2006 | Grace et al. | 427/255.6 |

FOREIGN PATENT DOCUMENTS

| | | |
|---|---|---|
| EP | 0585848 | 3/1994 |
| EP | 0982411 | 3/2000 |
| JP | 2003-293121 | * 10/2003 |
| WO | WO 2006/034028 A2 | 3/2006 |
| WO | WO 2006/052467 A2 | 5/2006 |
| WO | WO 2006/053017 A1 | 5/2006 |

* cited by examiner

*Primary Examiner* — Timothy H Meeks
*Assistant Examiner* — Elizabeth Burkhart
(74) *Attorney, Agent, or Firm* — Morgan, Lewis & Bockius LLP

(57) ABSTRACT

A method of vaporizing material at a uniform rate for forming a layer on a substrate includes feeding a column of vaporizable material from a temperature controlled region maintained below the vaporizable material's effective vaporization temperature to a source of vaporization energy, wherein the volume of the column can vary during vaporization; and providing a source of vaporization energy delivering a constant heat flux to the surface of the column so that a uniform volume per unit time of the vaporizable material is vaporized to form the layer on the substrate, irrespective of the feeding rate.

10 Claims, 5 Drawing Sheets

VAPORIZING MATERIAL AT A UNIFORM RATE

FIELD OF THE INVENTION

The present invention relates to methods and apparatus for vaporizing material in a chamber at a uniform rate when the feed rate at which the material is supplied may vary.

BACKGROUND OF THE INVENTION

Physical vapor deposition in a vacuum environment is the principal means of depositing thin films of material, such as the thin organic material films used in small molecule organic light-emitting diode (OLED) devices. Physical vapor deposition methods are well known, for example in U.S. Pat. No. 2,447,789 to Barr and in and in EP 0 982 411 Tanabe et al. The organic materials used in the manufacture of OLED devices are often subject to degradation when maintained at or near the desired rate-dependent vaporization temperature for extended periods. Exposure of sensitive organic materials to high temperatures can cause changes in the structure of the molecules and unwanted changes in material properties.

Sources is accomplished by placing a quantity of vaporizable material in a source and heating it to a very well controlled and constant temperature. Because the temperature stability directly influences the deposition rate stability, it is very important to maintain a constant source temperature. The relationship between vapor pressure, and hence deposition rate, versus material temperature for two organic materials is shown in the graph of FIG. 1. From FIG. 1, it is apparent that, over a range of values, a small perturbation in source temperature can cause a sizable perturbation in vapor pressure. This amplification is particularly pronounced at higher temperatures.

In light of this temperature-to-pressure relationship, conventional vapor deposition sources have a relatively large thermal mass that is useful in minimizing temperature fluctuations. However, as a result, it can require many hours to achieve an equilibrium temperature and a stable vapor deposition rate when using this conventional approach. Due to the relative thermal sensitivity of organic materials, the conventional approach has been to load only small quantities of organic materials into a source at a time and to apply as little heat as possible. Drawbacks of this conventional process include the loss of some portion of the material before it has reached the temperature exposure threshold, a very low vaporization rate due to the limitation on heater temperature, and limited operation time of the source due to the small quantity of material present in the source. Using this prior technique, it has been necessary, when recharging a source, to vent the deposition chamber, disassemble and clean the vapor source, refill the source, reestablish vacuum in the deposition chamber and degas the just-introduced organic material over a period of several hours before resuming operation. The low deposition rate and the frequent and time consuming process associated with recharging a source has placed substantial limitations on the throughput of OLED manufacturing facilities.

One alternative to conventional vapor deposition methods is the use of a flash vaporization system utilizing a feeding mechanism to deliver vaporizable material to a heating element where it is rapidly vaporized. Referring to the perspective diagram of FIG. 3, a feeding apparatus 20 provides a continuing supply of a vaporizable material 22 into a deposition chamber 24 for forming a layer on a surface 26. A heating element 30 provides the needed vaporization energy to the vaporizable material 22. Feeding apparatus 20 effectively provides a temperature controlled region that maintains the vaporizable material 22 below its vaporization temperature in order to prevent degradation or breakdown of the vaporizable material 22 before it reaches heating element 30. Feeding apparatus may use an auger or other mechanism for providing a constant supply of vaporizable material 22. A severe limitation of prior art flash vaporization systems, where the evaporable material is not in liquid form, is the inability to maintain a steady vaporization rate because even small variations in the delivery rate disturb the vaporization rate. Because of this rate stability problem, the conventional approach teaches away from flash vaporization systems, even where vaporizable material is continuously metered to a heating element. As just one example of the bias against flash vaporization, Loan in U.S. Pat. No. 6,296,711 specifically teaches away from the use of flash vaporization system, preferring instead to distribute the dispensed evaporable material over a cone shaped heating element having an ever-increasing surface area.

Recently, flash vaporization PVD sources have been developed that employ a very low thermal mass heating element for vaporizing material. Advantageously, this allows a material that is being metered to be maintained at a temperature that is well below the material's effective vaporization temperature. However, there is a significant difficulty with flash vaporization techniques. When using such a system, the vaporization rate is directly related to the material feed rate for a constant heating element temperature. Perturbations in the material feed rate to the flash vaporization heating element, with the heating element maintained at a constant temperature, are seen directly as perturbations in the resulting vapor deposition rate. Higher frequency perturbations may be attenuated where a manifold is employed to distribute the vapor over a length or area, as long as the period of the perturbation frequency is higher than the residence time of the vapor in the manifold. Lower frequency perturbations in the feed rate, however, can be more serious, leading to thickness non-uniformity of the deposited films in scanning type sources.

Those skilled in the materials metering arts can well appreciate the difficulty of obtaining a constant feed rate with minute quantities of materials. Many prior art deposition sources used in the manufacture of OLED devices deposit organic thin films at a rate on the order of 100 µg/s or less. In deposition systems where the OLED substrate is scanned past the source or vice versa, it is necessary to maintain a constant deposition rate in order to achieve film thickness uniformity of the deposited film. Typically, film thickness uniformity for OLED fabrication must be better than +/−5%. Using a feeding mechanism in cooperation with a flash vaporization system at these deposition rates would require feeding uniformity of +/−5 µg/s. This precision level of uniformity would be extremely difficult to achieve using, any of today's known metering technologies for any materials not in liquid form.

One approach for minimizing the effect of low frequency perturbations in the feed rate is to employ a conventional closed loop feedback scheme. A manifold pressure sensor or deposition rate sensor can be used as a feedback element to the closed loop control system to adjust the feed motor speed and the heating element temperature to attain a constant deposition rate. Feed forward control schemes can be used advantageously in conjunction with feedback schemes where there is a known and predictable periodicity to the material feed rate. In this case, a motor speed profile can be preprogrammed to compensate an assignable variation in metering device performance. Adjusting the material feed rate alone however, provides only limited deposition rate control because there may be a time lag of several seconds between a control signal to the feed motor and the resulting change in deposition rate. In addition, material feed rate is not a bi-directional control variable. Material already metered to the heating, element cannot typically be retrieved if the deposition rate rises above the desired control limit.

The other factor that could be controlled in a closed loop system is the heating element temperature. In contrast to the feed rate, change to the heating element temperature produces an almost instantaneous change in deposition rate and is bi-directional. The influence of temperature change, however, can only be applied over a short time interval. If the heater temperature is driven too high or too low for an extended period of time there can be a material-starved or material-overload condition at the heating element.

With these considerations, it is evident that closed loop control would require controlling both the material feed rate to the heating element as well as the heating element temperature in order to produce a constant deposition rate. Such a closed loop, multi-variable control method is relatively complex as it requires a relationship to be maintained between the material feed rate and the heating element temperature, and it requires tuning to optimize numerous gain settings and requires sensing of material feed, heating element temperature, and vapor deposition rate.

For OLED fabrication, pharmaceutical manufacture, and a number of other applications, there is a need for vapor deposition apparatus and methods that provide continuous operation and highly uniform results without the need for complex and expensive sensing and control components.

SUMMARY OF THE INVENTION

It is an object of the present invention to provide an improved way of uniformly vaporizing a material fed into a chamber at a variable rate to form a layer on a substrate.

This object is achieved by method of vaporizing material at a uniform rate for forming a layer on a substrate comprising:

a) feeding a column of vaporizable material from a temperature controlled region maintained below the vaporizable material's effective vaporization temperature to a source of vaporization energy, wherein the volume of the column can vary during vaporization; and b) providing a source of vaporization energy delivering a constant heat flux to the surface of the column so that a uniform volume per unit time of the vaporizable material is vaporized to form the layer on the substrate, irrespective of the feeding rate in step a).

A device and method of operating flash vaporization PVD sources has been demonstrated that overcomes the deposition rate instability problems commonly associated with flash vaporization sources. The present invention achieves steady vapor deposition rates without a closed loop control system despite substantial variations in material feed rate. A closed loop control is necessary only to correct long-term deposition rate drift. This open loop control strategy has been demonstrated with materials that vaporize directly as well as those that melt to a liquid form before vaporizing.

The apparatus and method of the present invention provide a self-compensating vaporization system for vaporizing and depositing a material at a stable rate in spite of some variability in feed rate.

The apparatus and method of the present invention enable continuous deposition of material at high uniformity using conventional material metering mechanisms. The vaporizable material is maintained at a low temperature during feeding, until it is extended to a position very close to the heating element, minimizing degradation of the material due to exposure to elevated temperatures.

DETAILED DESCRIPTION OF THE INVENTION

For the description of the present invention that follows, a number of terms must be defined. A "uniform rate" for vapor deposition on a surface would yield a target layer thickness that is uniform to within at least +/−4%, preferably within +/−2%. A "uniform volume" of vaporized material would be provided when the uniform rate is maintained within this tolerance range. A constant heat flux, or constant (DC) current applied to provide a constant heat flux, would vary from an average value by not more than +/−4%, preferably, not by more than 2%. "Low pressure conditions" are defined as having at least some form of vacuum, that is, less than atmospheric pressure conditions.

Figure 3:
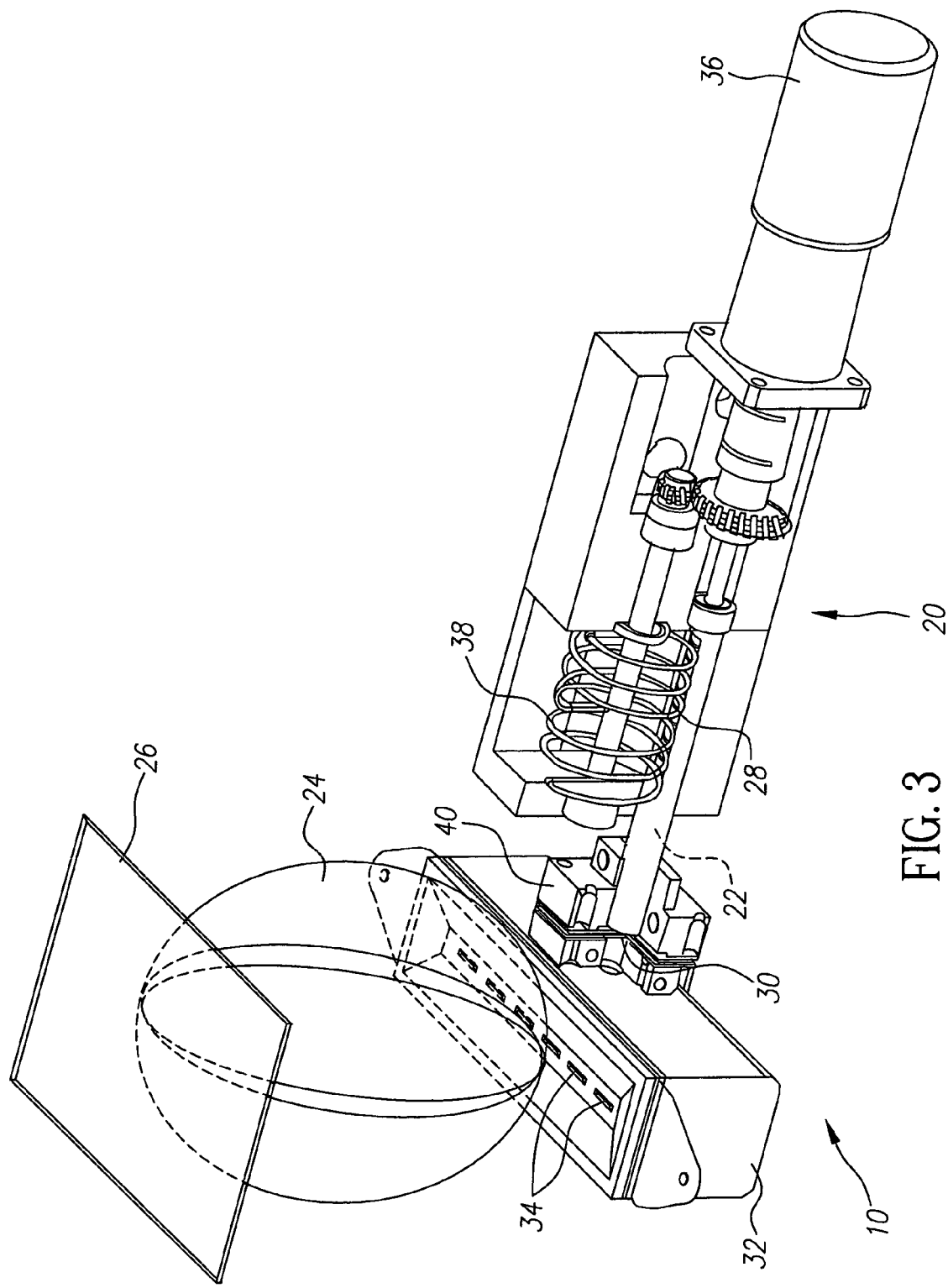
FIG. 3 is a perspective showing components of a vapor deposition apparatus according to one embodiment.
Figure 4:
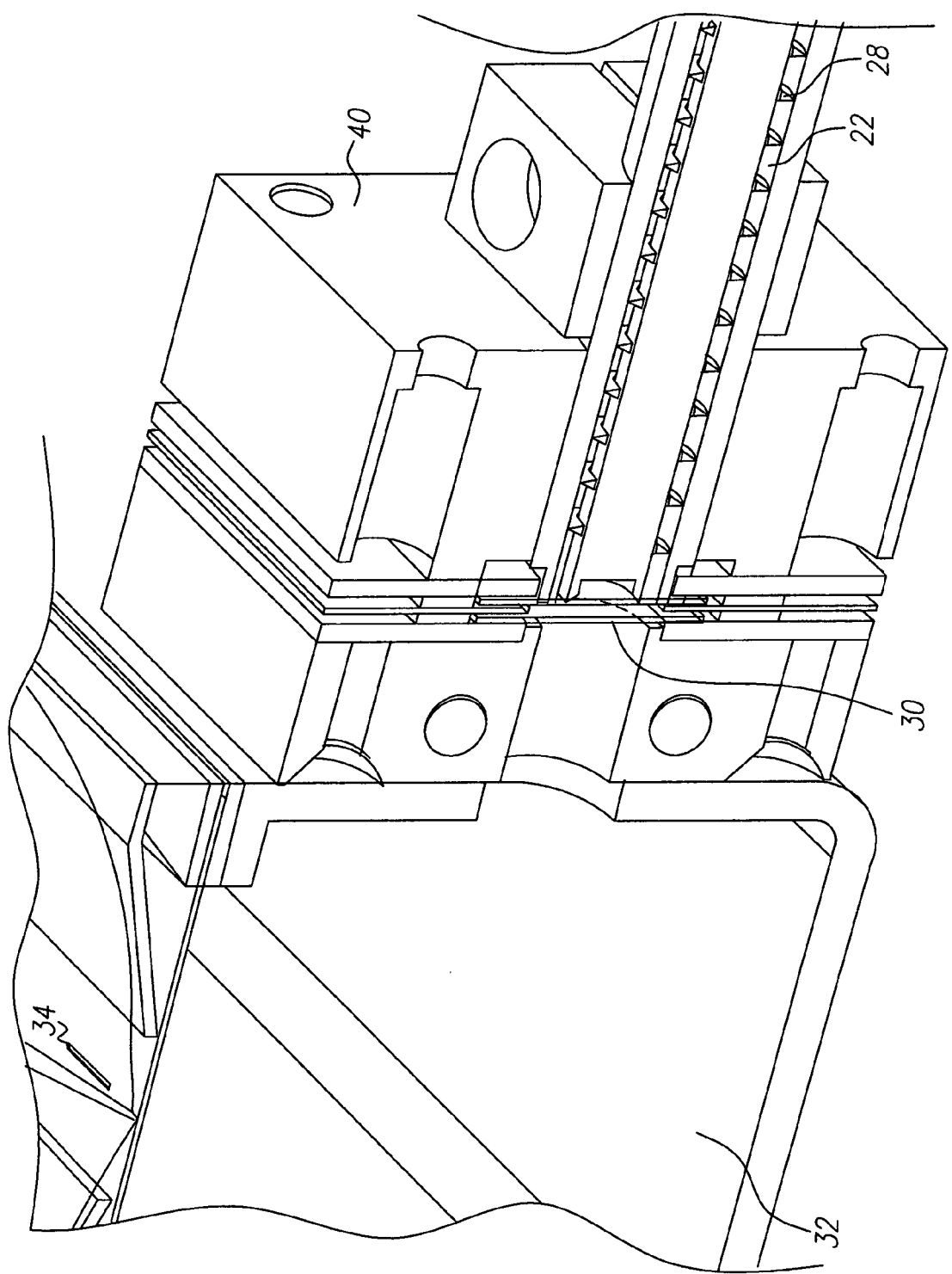
FIG. 4 is a close-up a perspective showing components of a vapor deposition apparatus.

Referring to FIGS. 3 and 4, there are shown perspective cross-sectional views of material feeding and vaporization components in a vapor deposition apparatus 10 according to one embodiment of the present invention. Feeding apparatus 20 utilizes an auger screw 28 to urge vaporizable material 22 forward toward heating element 30. Vaporized material 22 then issues into a manifold 32 and is then delivered through apertures 34 to deposition chamber 24, which is typically under low pressure conditions. Auger screw 28 is driven by a motor 36 and may include a supporting agitation device such as an agitator helix 38. Agitator helix 38 may be used with small diameter auger screws 28 and rotates through the reservoir of particulate material to help fluidize the material and thereby assure its entry into the auger screw 28. Auger screw 28 rotates inside of a stationary auger barrel to convey the material along the inside of the barrel to heating element that is in close spaced relation to the end of the auger screw and auger barrel. The particulate material is metered toward heating element 30 at a rate determined by the rotational speed of auger screw drive motor 36. The metered material is vaporized as it comes into contact with or in close proximity to heating element 30 and issues into manifold 32 as a vapor.

It has been observed that for a constant rotational velocity, a single lead auger screw 28 produces a generally sinusoidally varying powder feed rate where the period of the feed rate oscillation corresponds to one revolution of the auger screw 28. This feed rate oscillation produces a corresponding deposition rate variation whose amplitude can be as much as +/−20% even with a relatively fine screw thread pitch.

Conventional practice teaches that a constant vaporization rate is achieved by maintaining the heating element at a constant temperature. According to this practice, the electrical current that is necessary to maintain heating element 30 at constant temperature must then vary with any oscillations in material feed rate and should exhibit the same periodicity. However, in applications where a uniform film thickness is to be deposited on a substrate as it passes over a stationary deposition source, such as in roll-to-roll coating, this variation in deposition rate manifests itself as a non-uniform deposited film thickness.

It has been found that, contrary to expectations and to the teaching of prior art, an improved deposition rate uniformity can be obtained, without closed loop control, from a flash vaporization PVD source that employs a low thermal inertia heating element when supplied with a constant current. That is, by allowing the temperature of the flash vaporization heating element to vary, without closed loop control, highly uniform vaporization rates can be obtained, contrary to expectations. As vaporizable material 22 is fed to the heating element, the drive current delivered to the heating element is maintained at a constant level, in spite of known variability in material delivery rate and in spite of the fact that the temperature of the heating element can be shown to be changing due to the change in material delivery. Empirical data show that, when a constant current is provided to heating element 30, the temperature of the heating element may even vary by as much as +/−30 degrees C. yet yield deposition uniformity of better than 2%. Referring back to FIG. 1, which shows that a very slight change in temperature of a few degrees C yields significant changes in vapor pressure for two typical organic materials, it is surprising that merely maintaining a constant current to the heating element provides such high performance in achieving deposition uniformity. The remarkably large changes in equilibrium vapor pressure for a +/−8.5% change in heater temperature would intuitively motivate one skilled in the art to design the vaporization system to maintain a constant heating element temperature. However, techniques employing a constant heating element temperature are typically capable of achieving no better than about +/−20% deposition rate variation. Meanwhile, applying a constant current to the heating element, and allowing the temperature of the heating element to vary as the material supply varies, yields deposition rate variation within +/−2% or less.

Figure 1:
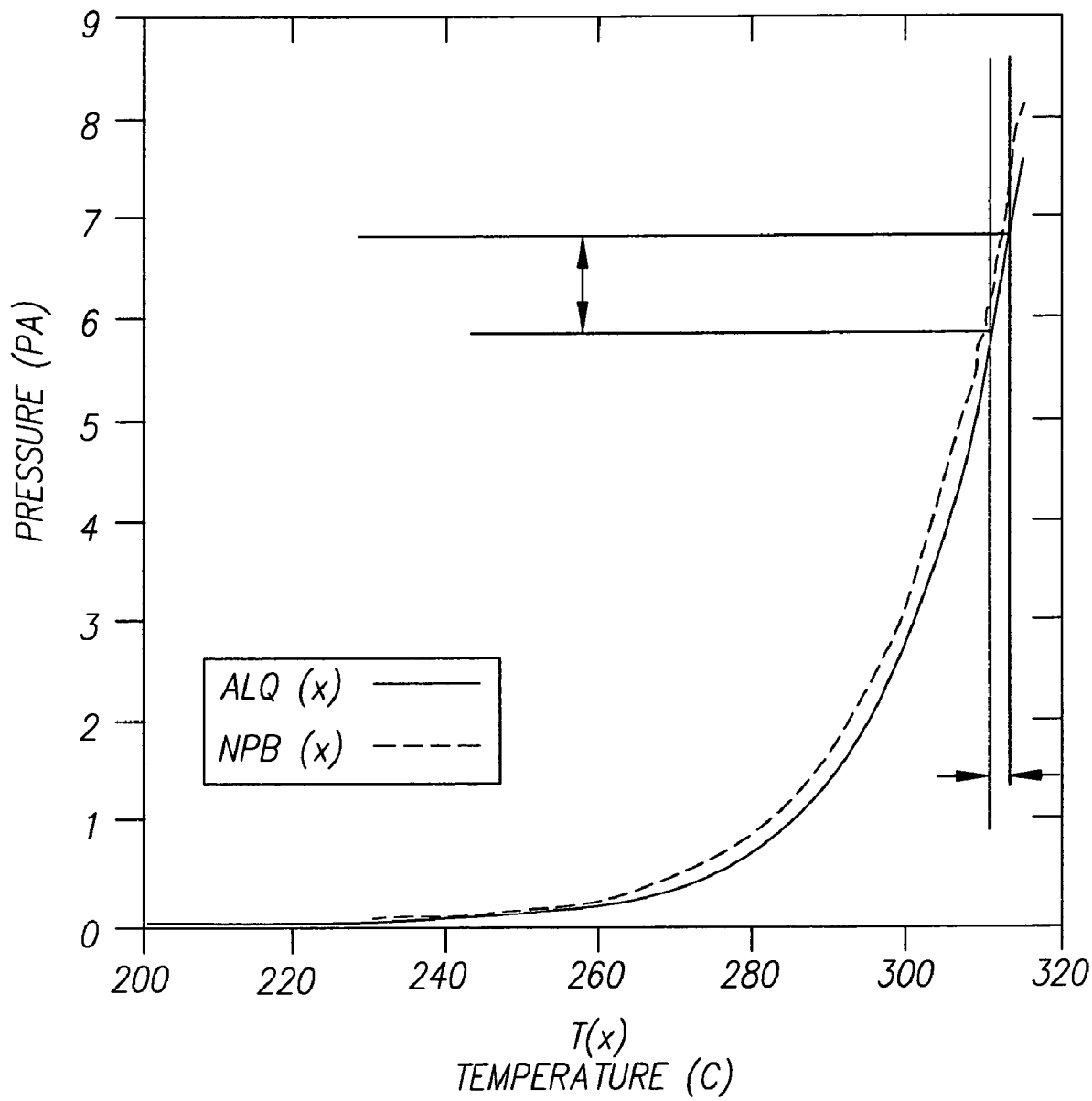
FIG. 1 is a graph showing vapor pressure versus temperature for two vaporizable materials.
Figure 2:
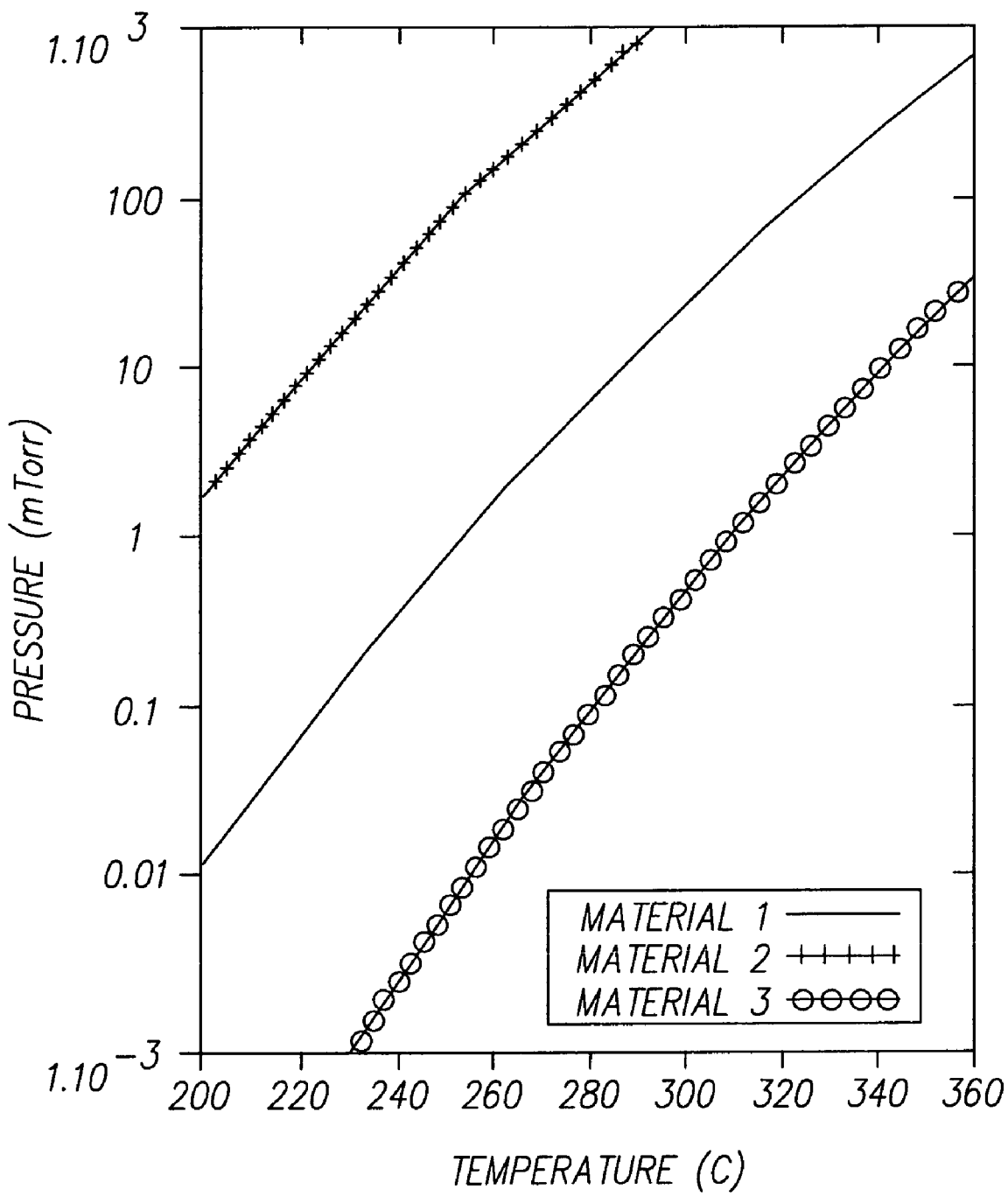
FIG. 2 is a graph showing vapor pressure versus temperature for three vaporizable materials having widely different vapor pressures at a given temperature.

Even more unexpected is that maintaining constant current to heating element 30 provides exceptional uniformity not only when two organic materials have somewhat similar saturation vapor pressure vs. temperature characteristics, but even where different materials have widely differing pressure response to temperature. For example, the linear-to-linear graph of FIG. 1 shows reasonably close characteristic saturation vapor pressure vs. temperature curves for two organic materials. FIG. 2, on the other hand, shows, in a log-to-linear graph, saturation vapor pressure vs. temperature curves for three organic materials that vary significantly from each other, by about 3 orders of magnitude, and represent most of the range of the organic materials of interest. However, even where there is such pronounced difference between materials, the constant-current approach of the present invention provides uniformity in spite of delivery at a variable rate. Moreover, empirical data also indicate that this effect is obtained for organic materials that vaporize directly from a solid and materials that melt to a liquid phase before vaporizing as well as mixtures of materials exhibiting both of these behaviors. Clearly, using flash vaporization with the heater architecture and materials metering mechanism shown in FIGS. 3 and 4, a rate control mechanism not taught in conventional practice is operational.

Figure 5:
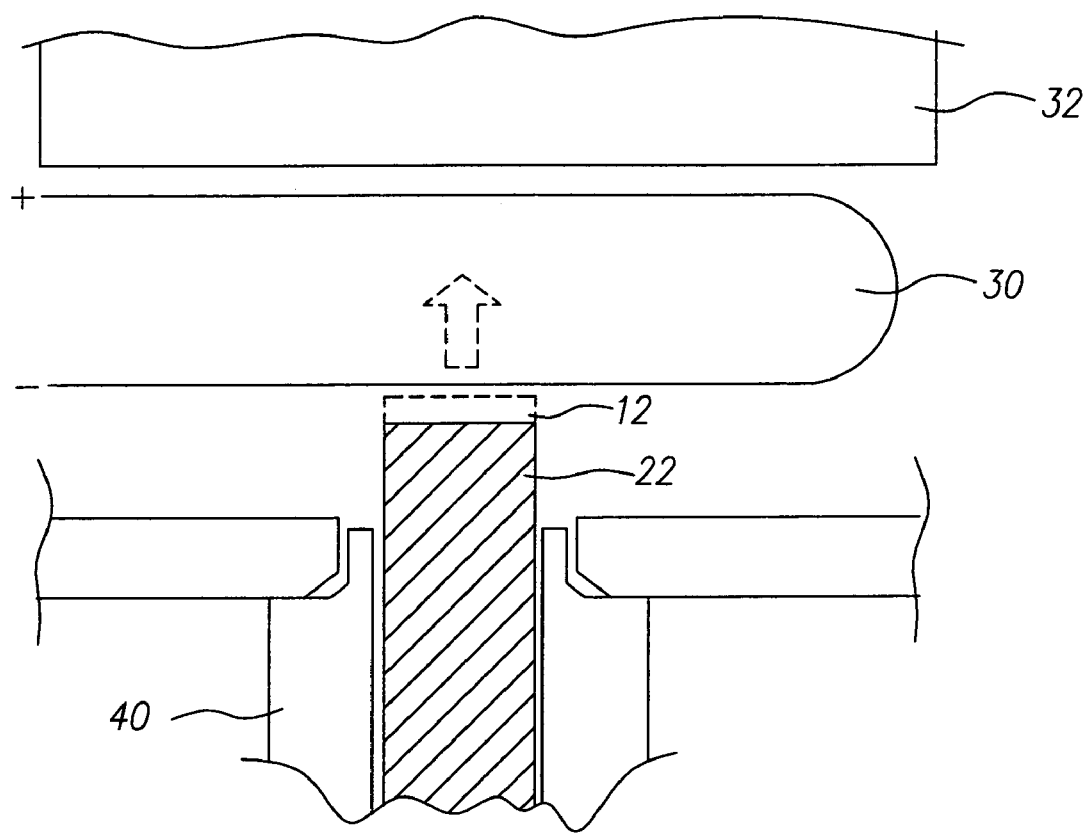
FIG. 5 is a functional block diagram showing the basic interaction between the heating element and the material feed path.

Referring to FIG. 5, there is shown, in highly exaggerated form, a side view diagram of heating element 30 in one embodiment. A column of vaporizable material 22 is fed (upwards in the orientation of FIG. 5) past a cold sink 40 and toward heating element 30. A vapor 12 is formed near the interface of the column of vaporizable material 22 and heating element 30 and issues into manifold 32, as was shown with reference to FIGS. 3 and 4. In the embodiment of FIG. 5, heating element 30 is a screen of suitable mesh for applying heat and allowing vapor 12 to pass into manifold 32.

Figure 6:
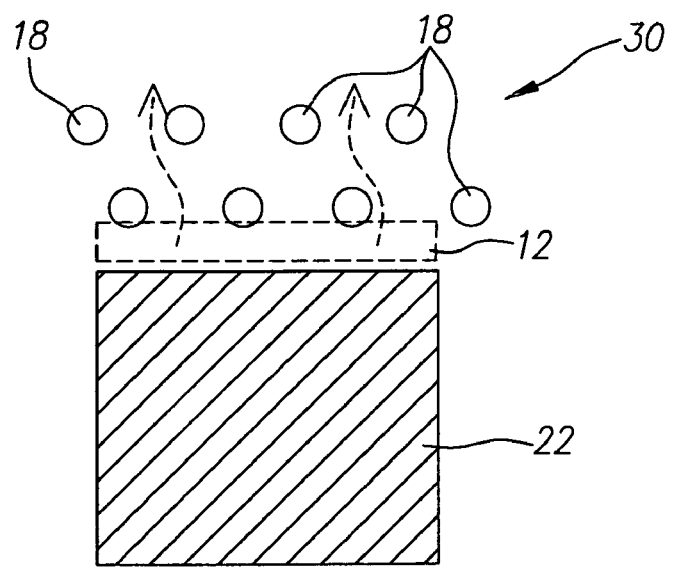
FIG. 6 is a functional block diagram showing the interaction of the heating element with the vaporizable material.

FIG. 6 shows a close-up of heating element 30 in cross-section, in highly exaggerated form. Wires 18 of heating element 30 are resistive heating wires that form the mesh of the screen in the embodiment of FIG. 5. In the embodiments of FIGS. 5 and 6, the screen of heating element 30 is folded and wires 18 interleaved to provide an evenly heated vapor 12 as it passes through. Other embodiments are possible. For example, an unfolded screen or other configuration could serve as a suitable heating element 30.

In another embodiment, heating element 30 has a pair of 90 mesh, woven stainless steel screens spaced 1 mm apart and having an unblocked open area percentage greater than 40 percent and preferably greater than 70 percent. The screens may be connected in series and heated by passing a current through the wires comprising the screen. The first screen operates in very close proximity to the exposed surface of the column of vaporizable material 22 and as result, the areas of vaporizable material 22 that lie between screen wires 18 receive less radiant energy than areas of vaporizable material 22 having a more direct line of sight. The second screen is spaced 1 mm away from the first screen and is able to deliver radiant energy to areas not shadowed by the elements of the first screen. In this manner, column of vaporizable material 22 receives a much more uniform radiant heat distribution than if a single, unfolded screen were employed as heating element 30. Both screens have relatively good conductance to vapor flow and have a very low thermal mass, so low as to demonstrate a 10° C. sinusoidal temperature variation having an 8 ms period when driven with a 60 Hz alternating current in vacuum. These elements are able to store only a minute amount of thermal energy and as a result, the energy available to heat and vaporize material corresponds very closely to the heat energy instantaneously delivered to heating element 30.

When the screen or screens of heating element 30 are driven to maintain a constant temperature, the instantaneous power delivered must vary according to variations in material delivery rate and the vaporization rate is seen to vary synchronously. When, instead, the screens are driven with a constant current or power, as in the method of the present invention, the temperature of the first screen may vary, but the power available to heat and vaporize the material is constant, resulting in a constant vaporization rate.

One advantage of the flash vaporization mechanism relates to its small thermal mass. Clearly if the thermal mass of the heating element were large, enabling it therefore to store thermal energy as in more conventional configurations, the system would respond as if driven at a constant temperature even if the supplied heating current were constant. The vaporization rate would then vary synchronously with variations in the material feed rate, resulting in unacceptable variations in deposited film thickness.

The improvement disclosed herein is a flash vaporization system where the cross sectional area of vaporizable material 22 remains constant as it is metered into in the space between a constant temperature cold sink and a heating element, in combination with a heating element or elements having very low thermal inertia that are heated with invariant power input. A vaporization system according to these specifications can produce a relatively invariant material vaporization rate despite a limited, temporal variation in the delivery rate of vaporizable material 22. The vaporization system is constructed such that thermal energy actually available to vaporize material remains constant and serves to stabilize the vaporization rate without the need for an external control mechanism.

The rate stability afforded by the constant current flash vaporization source used as heating element 30 relates to a set of heat transfer mechanisms. It is postulated that the lengths of the solid and vapor portions of vaporizable material 22 in the thermal path between heating element 30 and a cold sink 40 vary under dynamic conditions where the feed rate varies cyclically. A feed rate variation above the nominal level increases the solid conduction path length between heating element 30 and cold sink 40 and decreases the vapor path length by the same amount. If the solid thermal conductivity is several orders of magnitude larger than that of the vapor, then the composite thermal conductance of the path between the cold sink and the heating element will increase and the temperature of the constant current driven heating element will decrease. The reduced temperature of heating element 30 decreases the radiant energy delivered to the column of vaporizable material 22, but the solid portion of the column is now longer and has a lower thermal conductance than previously. A greater percentage of the delivered energy is now available to vaporize vaporizable material 22 since less energy is conducted through the column of material to the cold sink. The result is that a constant vaporization rate is maintained, although at a longer solid column length and lower heating element 30 temperature than in the nominal condition. With respect to FIG. 5, it must be observed that the cross-sectional area of the surface of the column of vaporizable material 22 that is presented to heating element 30 remains substantially constant during feeding. The length of the column of vaporizable material 22 that extends between cold sink 40 and heating element 30 may vary.

When the feed rate varies below the nominal level, the solid material path length is reduced by the same amount that the vapor path length increases. The composite thermal conductance between cold sink 40 and heating element 30 decreases and allows the temperature of the constant current driven heating element 30 to increase. The increased heating element 30 temperature radiates more heat to a column of solid vaporizable material 22, now shorter that has a higher thermal conductance than previously. A smaller percentage of the delivered energy is now available to vaporize vaporizable material 22 since more of the delivered heat is conducted through the solid to cold sink 40. The result is that a constant vaporization rate is maintained, although at a shorter solid column length and higher heating element 30 temperature than in the nominal condition.

The thermal balance described above enables a constant vaporization rate to be maintained over a broad range of solid material path length values and allows stable vaporization rate control over a broad range of material feed rates and current values for heating element 30. An analytical model of the system predicts a constant vaporization rate as long as the solid column length is at least half of the distance between cold sink 40 and heating element 30. To operate at a desired vaporization rate, the motor speed of auger screw 28 can be selected to deliver the desired material mass flow rate of vaporizable material. Electrical current is applied to heating element 30 at a level that causes the vaporizable material 22 path length, including any variations due to the feed rate, to be at least equal to half of the distance between cold sink 40 and heating element 30. When this condition is satisfied, the vaporization rate will be stable and will be equal to the average solid mass flow rate. This same analytical model suggests that the vaporization rate would vary directly with solid column length if heating element 30 were driven at a constant temperature as is conventionally taught.

By foregoing closed loop control of the temperature of heating element 30 and providing a constant current to heating element 30 instead, the method and apparatus of the present invention obtain a pronounced improvement in vapor deposition uniformity, with a large tolerance for feed rate variation over time. When the proper level of current is determined for a given range of feed rates and heating element 30 characteristics, components of vapor deposition apparatus 10 effectively self-compensate for changes in feed rate over the given range and maintain a substantially constant vapor pressure.

As was described with reference to FIGS. 1 and 2, the apparatus and method of the present invention can be used for vaporization deposition of organic materials having saturation vapor pressure vs. temperature response over a broad range, incorporating numerous, if not all, organic materials of interest.

The invention has been described in detail with particular reference to certain preferred embodiments thereof, but it can be understood that variations and modifications can be effected within the spirit and scope of the invention. For example, the specific arrangement of the flash vaporization components of heating element 30 may take any of a number of forms. Feeding apparatus 20 may be implemented in any of a number of configurations. Deposition chamber 24 may be any of a broad range of devices adapted for containing vaporized material and the substrate to which the material is deposited.

Thus, what is provided is a method and apparatus for vaporizing material in a chamber at a uniform rate when the feed rate at which the material is supplied may vary.

The invention has been described in detail with particular reference to certain preferred embodiments thereof, but it will be understood that variations and modifications can be effected within the spirit and scope of the invention.

PARTS LIST

10 Vapor deposition apparatus
12 Vapor
18 Wires
20 Feeding apparatus
22 Material
24 Deposition chamber
26 Surface
28 Auger screw
30 Heating element
32 Manifold
34 Aperture
36 Motor
38 Agitator helix
40 Cold sink

The invention claimed is:

1. A method of vaporizing particulate organic material at a uniform rate for forming an organic layer on a substrate, comprising:
   a) providing a chamber under low pressure conditions;
   b) providing a heating element within the chamber that produces heat;
   c) feeding at least one particulate organic material into the chamber to form an annular column of vaporizable material, wherein the cross-sectional area of the annular column is constant, but the volume of the annular column varies according to changes in the feed rate;

d) providing a cold sink in operative relationship with the annular column to maintain the sides and bottom portion of the annular column at a controlled temperature below the effective vaporization temperature; and e) applying a constant current to the heating element so that a heat flux is delivered to the top surface of the annular column to vaporize the material to form the organic layer on the substrate, wherein the heating element has a low thermal mass so that a uniform volume per unit time of the material is vaporized when the feed rate of the annular column varies.

2. The method of claim 1 wherein the length of the annular column between the temperature controlled region and the heating element varies during vaporization, while the cross-sectional area of the surface of the annular column is substantially constant.

3. The method of claim 1 wherein the heating element is a flash vaporization heating element.

4. The method of claim 1 further including providing a manifold in communication with the chamber for receiving vaporized material and the manifold defining an opening positioned in relationship to the substrate so that vaporized material passes through the opening to form the layer on the substrate.

5. The method of claim 4 further including delivering material into the chamber by a movable device.

6. The method of claim 5 wherein the movable device is an auger.

7. The method of claim 1 wherein the step of feeding at least one organic material comprises the step of feeding a first organic material and a second organic material wherein, over a portion of the vaporization temperature range, the vapor pressure of the first material exceeds the vapor pressure of the second material by an order of magnitude.

8. The method of claim 1, wherein the heating element includes a pair of spaced apart mesh screen layers electrically connected in series, the vaporized material passing through the mesh screen layers.

9. A method of vaporizing particulate organic material at a uniform rate for forming an organic layer on a substrate, comprising:

providing a chamber under low pressure conditions;

providing a heating element within the chamber that produces heat;

feeding at least one particulate organic material into the chamber to form an annular column of vaporizable material, wherein the cross-sectional area of the annular column is constant, but the volume of the annular column varies according to changes in the feed rate;

providing a cold sink in operative relationship with the annular column to maintain the sides and bottom portion of the annular column at a controlled temperature below the effective vaporization temperature; and applying a constant heat flux from the heating element to the surface of the column so that a uniform volume per unit time of the material is vaporized to form the organic material on the substrate, wherein the column length is at least half of the distance between the cold sink and the heating element.

10. The method of claim 9, wherein the heating element includes a pair of spaced apart mesh screen layers electrically connected in series, the vaporized material passing through the mesh screen layers.

* * * * *